(12) United States Patent
Gasiot et al.

(10) Patent No.: US 11,131,782 B2
(45) Date of Patent: Sep. 28, 2021

(54) IONIZING RADIATION DETECTOR

(71) Applicant: STMicroelectronics (Crolles 2) SAS, Crolles (FR)

(72) Inventors: Gilles Gasiot, Seyssinet-Pariset (FR); Fady Abouzeid, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 123 days.

(21) Appl. No.: 16/677,005

(22) Filed: Nov. 7, 2019

(65) Prior Publication Data

US 2020/0150292 A1    May 14, 2020

(30) Foreign Application Priority Data

Nov. 12, 2018 (FR) ...................... 1871486

(51) Int. Cl.
*G01T 1/24* (2006.01)
*H01L 27/07* (2006.01)
*H01L 31/103* (2006.01)

(52) U.S. Cl.
CPC .............. *G01T 1/248* (2013.01); *G01T 1/247* (2013.01); *H01L 27/0761* (2013.01); *H01L 31/103* (2013.01)

(58) Field of Classification Search
CPC ..... G01T 1/248; G01T 1/247; H01L 27/0761; H01L 31/103; H01L 29/78639; H01L 29/78654; H01L 31/119; H01L 31/115
See application file for complete search history.

(56) References Cited

U.S. PATENT DOCUMENTS

| 3,452,206 | A |   | 6/1969 | Biet et al. |
| 3,973,146 | A | * | 8/1976 | Arnold .................. H01L 27/112 257/254 |
| 4,808,809 | A | * | 2/1989 | Hayakawa ............... G01V 8/12 250/205 |
| 2005/0023476 | A1 | * | 2/2005 | Haas ...................... H04N 5/335 250/370.11 |
| 2009/0113357 | A1 |   | 4/2009 | Abadeer et al. |
| 2011/0037969 | A1 | * | 2/2011 | Spickermann ........ G01S 7/4863 356/5.01 |

FOREIGN PATENT DOCUMENTS

EP    0543745 A1    5/1993
JP    S59132673 A   7/1984

OTHER PUBLICATIONS

INPI Search Report and Written Opinion for FR 1871486 dated May 24, 2019 (9 pages).

* cited by examiner

*Primary Examiner* — Marcus H Taningco
(74) *Attorney, Agent, or Firm* — Crowe & Dunlevy

(57) ABSTRACT

A diode and a transistor are connected in parallel. The transistor is located on a first doped region forming a PN junction of the diode with a second doped region located under the first region. The circuit functions as an ionizing radiation detection cell by generating a current through the PN junction which changes by a voltage generated across the transistor. This change in voltage is compared to a threshold to detect the ionizing radiation.

22 Claims, 2 Drawing Sheets

IONIZING RADIATION DETECTOR

PRIORITY CLAIM

This application claims the priority benefit of French Application for Patent No. 1871486, filed on Nov. 12, 2018, the content of which is hereby incorporated by reference in its entirety to the maximum extent allowable by law.

TECHNICAL FIELD

The present disclosure generally concerns electronic devices, particularly integrated circuits, and in particular an ionizing radiation detector.

BACKGROUND

Certain integrated circuits are enabled to detect ionizing radiations. Ionizing radiations are generally formed of, or originate from, high-energy particles, that is, particles having an energy greater than a few eV, for example, greater than approximately 13 eV, most often greater than 1 keV, or even greater than 1 MeV. Such particles are typically protons, neutrons, or alpha particles.

There is a need in the art for an ionizing radiation detector that addresses known disadvantages of prior art detector circuits

SUMMARY

An embodiment provides a device comprising a diode and a transistor connected in parallel, the transistor being located on a first region forming a PN junction of the diode with a second region located under the first region.

According to an embodiment, the transistor is located on an electrically-insulating layer covering the first region.

According to an embodiment, the transistor comprises a channel region and two drain/source regions located on either side of the channel region, the channel region and the drain/source regions being on top of and in contact with the electrically-insulating layer.

According to an embodiment, the transistor has an N channel and the first region is N-type doped.

According to an embodiment, the device comprises a semiconductor substrate having a portion defining the second region, and a doped well having a portion defining the first region.

According to an embodiment, said well comprises a portion extending outside of the location vertically in line with the transistor.

An embodiment provides a detector of ionizing radiations comprising one or a plurality of devices such as defined hereabove.

According to an embodiment, the diode of one of said devices is coupled to a gate of the transistor of another one of said devices.

According to an embodiment, each of said devices comprises an inverter comprising one of said transistors.

According to an embodiment, said inverters are coupled in series.

An embodiment provides a method of detection of an ionizing radiation, comprising using a device such as defined hereabove.

According to an embodiment, the method comprises the generation of a current through the PN junction by the ionizing radiation.

According to an embodiment, the method comprises comparing a voltage across the transistor with a threshold.

According to an embodiment, said comparison comprises using another device such as defined hereabove.

According to an embodiment, the transistor of said other device is controlled by said voltage.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1A:
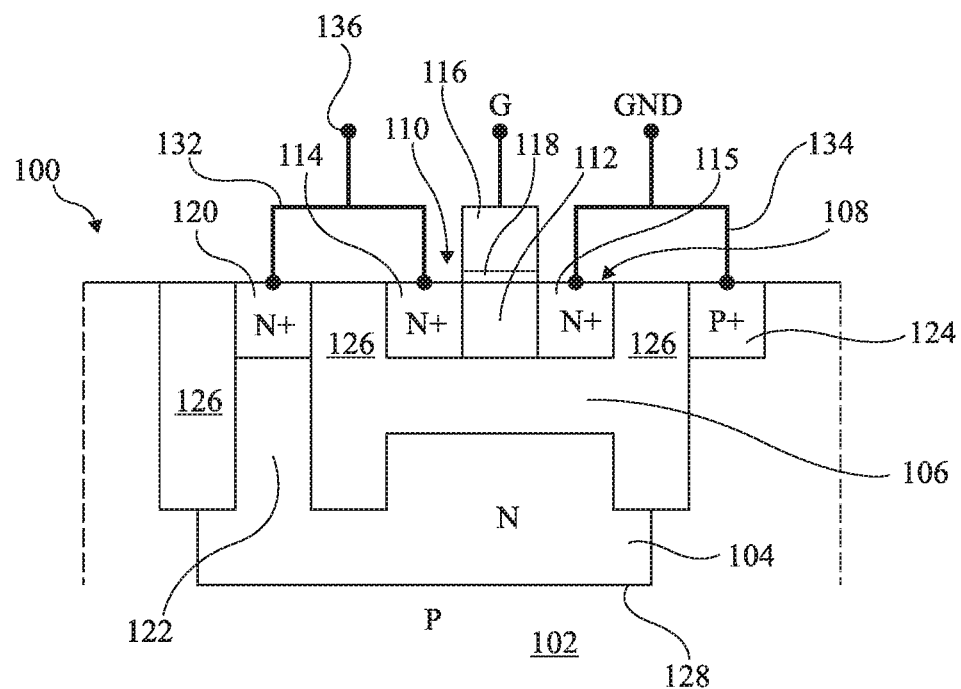
FIGS. 1A and 1B show a simplified cross-section view and a circuit diagram, respectively, of an embodiment of an ionizing radiation detection cell.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, circuits of application of a logic level and of detection of a temporary logic level change are not detailed, the described embodiments being compatible with usual logic circuits of application of a logic level and of detection of a temporary logic level change. Further, the methods of forming back-gate transistor structures and connections between the transistors, are not described in detail, the described embodiments being compatible with usual methods of forming such structures and connections.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

Unless otherwise specified, when reference is made to identical elements, this means identical to within the accuracy of their manufacturing method.

In the present description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", "approximately", and "in the order of" are used herein to designate a tolerance of plus or minus 10%, preferably of plus or minus 5%, of the value in question.

Figure 1B:
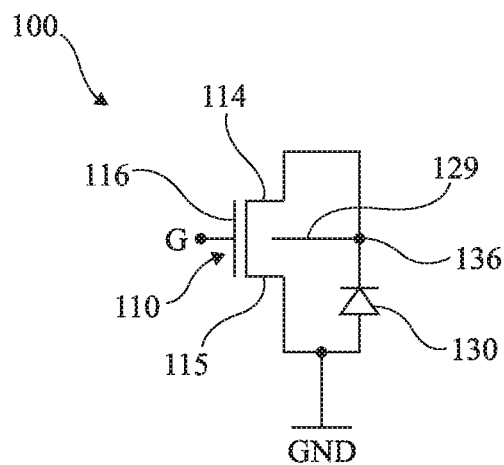

FIGS. 1A and 1B show a simplified cross-section view and a diagram, respectively, of an ionizing radiation detection cell 100.

Preferably, cell 100 is comprised within an ionizing radiation detector. The detector comprises the cell 100 or, preferably, a plurality of the cells 100. Cells 100 are then preferably similar or identical. The detector is, for example, used for ionizing radiations of spatial origin, typically in a satellite, particularly in a communication satellite such as a satellite used for the Internet.

Preferably, the detector is comprised within an electronic integrated circuit chip. The electronic chip comprises a semiconductor substrate 102, preferably made of silicon, for example, P-type doped. Cell 100 is then preferably at least partly formed inside and on top of a front surface (upper surface) of substrate 102.

As an example, the electronic chip is of SOC type ("System on Chip"). SOC-type chips are particularly used in embedded or mobile applications, in particular in transport or spatial applications. A SOC-type chip typically comprises a sequential data processing unit, for example, of microprocessor type, and various peripherals such as memories and/or interfaces of digital communication with the outside of the chip.

Cell 100 comprises a doped region 104 defined by a well, for example, N-type doped, located on the front surface side of substrate 102. Preferably, region 104 is at least partly located under an electrically-insulating layer 106, for example, made of silicon oxide. Layer 106 is preferably in contact with region 104. A portion of semiconductor layer 108, for example, made of silicon, is located vertically in line with region 104. Preferably, semiconductor layer 108 covers insulating layer 106. Cell 100 then preferably results from a manufacturing method based on a structure of SOI type ("Semiconductor On Insulator"), that is, a structure comprising substrate 102, the insulating layer 106 covering substrate 102, and semiconductor layer 108 on insulating layer 106.

A transistor 110 is located inside and on top of semiconductor layer 108. As an example, transistor 110 comprises a channel region 112, drain/source regions 114 and 115 on either side of channel region 112, and an insulated gate 116 arranged on channel region 112. Gate 116 corresponds to a transistor control node G. Regions 114 and 115 are preferably in contact with insulating layer 106. As an example, regions 114 and 115 are doped with the same conductivity type as well 104 (here, type N). Channel region 112 is then, for example, P-type doped. Regions 114 and 115 preferably have high doping levels (N+), for example, greater than that of region 104.

Cell 100 preferably comprises an area 120 of contact with region 104. Preferably, region 104 then defines a back gate 129 (FIG. 1B) of transistor 110. Contacting area 120 preferably comprises an area more heavily doped (N+) than region 104. Preferably, contacting area 120 is located on top of and in contact with an extension 122 of region 104 which extends outside of the location vertically in line with transistor 110.

The cell further preferably comprises an area of contact 124 with substrate 102. Contacting area 124 preferably comprises an area more heavily-doped (P+) than substrate 102.

Transistor 110 and contacting areas 120 and 124 are preferably delimited and separated by insulating trenches 126, for example, of STI ("Shallow Trench Isolation") type. Preferably, the insulating trenches surround contacting area 120 and transistor 110. Insulating trenches 126 extend from the front surface to a level located in region 104. Preferably, insulating trenches 126 extend all the way to a level located under the lower level of layer 106.

Doped region 104 forms with the substrate region located under it a PN junction 128 of a diode 130 (FIG. 1B). Diode 130 has electrodes defined by regions 102 and 104. The diode has terminals defined by contacting areas 120 and 124. PN junction 128 extends horizontally under transistor 110.

The channel region 112 of transistor 110 is entirely located vertically in line with PN junction 128. Preferably, drain/source regions 114 and 115 are entirely located vertically in line with PN junction 128.

Drain/source region 114 of transistor 110 is coupled to region 104, preferably connected to contacting area 120, by an electrically-conductive connection 132, for example, metallic. The drain/source region 115 of transistor 110 is coupled to substrate 102, preferably connected to contacting area 124, by an electrically-conductive connection 134, for example, metallic. Transistor 110 and diode 130 are thus electrically connected in parallel. Connection 132 couples, preferably connects, contacting area 120 and region 114 to a node 136. As an example, connection 134 couples, preferably connects, contacting area 124 and region 115 to a node of application of a reference potential GND such as the ground.

As an example, the chip comprises, in addition to cell(s) 100, structures identical or similar to that formed by the elements of cell 100 other than connections 132 and 134. In this example, each of these structures corresponds to a transistor (here, of N-channel MOS type) comprising a back gate. Preferably, contacting area 124 is common to a plurality of such back-gate transistors. Contacting area 120 and region 104 are, for example, common to a plurality of the back-gate transistors. The chip further comprises electrically-conductive connections between the back-gate transistors.

Cell(s) 100 may then be formed at the same time and with same manufacturing steps as the back-gate transistors and the connections between the transistors. This enables to obtain cells 100 without adding a step to the manufacturing of the back-gate transistors and of the connections between the transistors. Further, such a manufacturing may be implemented from a SOI-type structure.

Due to the fact that PN junction 128 is located under the transistor, cell 100 occupies a surface area of the chip smaller than that of an ionizing radiation detection cell which would comprise a diode and a transistor located in different locations (for example, laterally adjacent to each other).

In operation, node 102 is preferably coupled to a node of application of a positive potential by a resistive element, not shown in FIG. 1, for example, a P-channel MOS transistor. A particle of an ionizing radiation crossing the transistor is capable of generating a temporary current flowing from drain region 114 to source region 115. This causes a temporary decrease in the voltage across transistor 110. This voltage corresponds to the potential of node 136. The voltage decrease across transistor 110 is, for example, detected by comparing the value of the potential of node 136 with a threshold. Preferably, the threshold corresponds to a potential value located between high and low logic levels. The passage of the particle in the cell is thus detected.

Due to the fact that PN junction 128 is located under transistor 110, the particle thus crosses PN junction 128. This temporarily causes the flowing of a current through PN junction 128 of N region 104 towards P substrate 102. This current causes an additional decrease of the potential of node 136. The probability of detecting the passage of the particle, that is, the detection sensitivity, is thus increased. Thus, due to the presence of diode 130, cell 100 is more sensitive than a cell comprising only a transistor.

Further, cell 100 is more sensitive than a cell comprising a diode and deprived of a transistor on the diode. This is due to the fact that, in cell 100, the effect on the potential of node 136 of the current in transistor 110 adds to the effect of the current in diode 130.

Further, in the shown example where cell 100 is obtained from an SOI-type structure, semiconductor layer 108 has a thickness, for example, smaller than approximately 25 nm, preferably in the order of 7 nm. In PN junction 128, the current caused by the particle originates from charges generated on either side of PN junction 128 in a region having a thickness greater than that of layer 108. The ionizing radiation detection volume is thus higher in cell 100 than in a cell comprising only a transistor inside and on top of an SOI-type structure. Thus, the cell is much more sensitive, for example, more than 100 times more sensitive, or even more than 500 times more sensitive, than a cell comprising only a transistor inside and on top of an SOI-type structure.

Further, an ionizing radiation particle may cause a current temporarily flowing from extension 122 of region 104 to substrate 102. Thus, extension 122 contributes to the sensitivity of cell 100. Cell 100 is thus particularly sensitive.

As an example, the transistor gate has a width in the range from 10 nm to 200 nm. Insulating layer 106 has a thickness, for example, in the range from 10 nm to 300 nm. The height of the portion of region 104 located under layer 106 is, for example, in the range from 0.5 µm to 5 µm.

Figure 2:
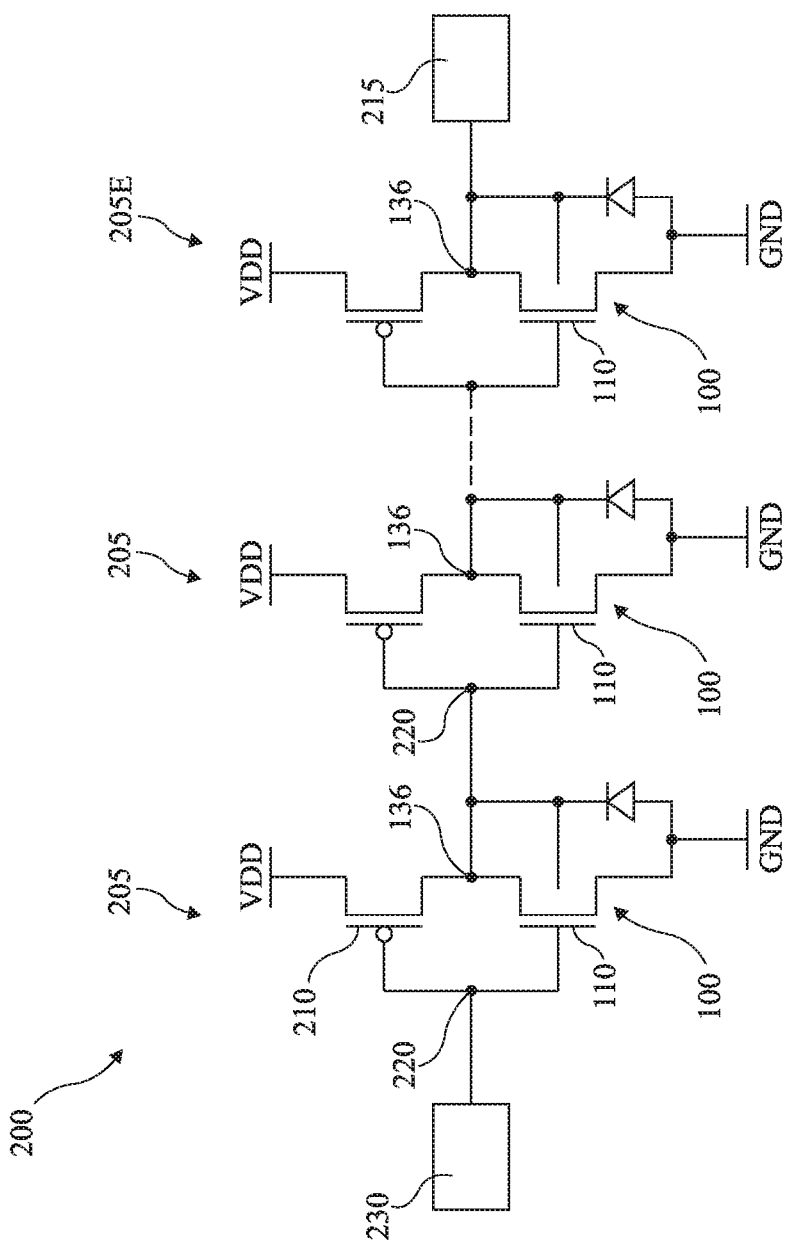
FIG. 2 partially and schematically shows an embodiment of an ionizing radiation detector.

FIG. 2 partially and schematically shows an ionizing radiation detector 200.

The detector comprises a plurality of inverters 205, 205E coupled, preferably connected, in series. Although three inverters are shown, the detector may comprise any number of inverters, for example, more than ten inverters, preferably more than 100 inverters, or even more than 1,000 inverters.

Each inverter 205, 205E comprises a cell 100 described in relation with FIG. 1. Preferably, contacting area 124 is common to a plurality of cells 205, 205E. Contacting area 120 and region 104 are, for example, common to a plurality of cells 205, 205E.

In each inverter 205, 205E, node 136 of cell 100 is coupled by a resistive element to a node of application of a positive potential VDD. The resistive element is preferably a P-channel field-effect transistor 210. In each inverter 205, 205E, the gates of transistor 210 and of transistor 110 are coupled, preferably connected, together to an input node 220 of the inverter. In each inverter 205, 205E, node 136 forms an output node of the inverter. The output of each inverter 205 of the series association other than the last inverter 205E of the series association is coupled to the input of the next inverter 205. The output of the last inverter 205E of the series association is coupled to a circuit 215 of detection of a temporary change of logic level. The input node 220 of the first inverter 205 of the series association is coupled to a circuit 230 supplying on this node a logic level, for example, a low logic level.

In operation, when an ionizing radiation particle crosses one of cells 100, the potential of node 136 of this cell, for example, temporarily decreases. When the potential is smaller than a threshold value defined by the threshold voltages of transistors 210 and 110 of the next cell, the logic level of the next cell changes. The temporary change of logic level is transmitted by series-connected inverters 205 all the way to circuit 215, which detects the logic level change. The passage of the particle is thus detected. An average detection frequency, corresponding to an intensity of the ionizing radiation, may then, for example, be counted.

Due to the fact that transistor 110 of each cell 100 is controlled by the output potential of the previous cell, the series association of cells 100 transmits all the way to circuit 215 a change of logic level of any of cells 100. A change of logic level of any of a plurality of detection cells might be transmitted to a detection circuit over connections coupling the cells independently from one another to the detection circuit. However, the forming of the series association of cells 100 of detection 200 is simpler than the forming of such independent connections.

Preferably, the inverters are similar or identical. The detector can thus be particularly simply designed and formed.

As a variation, inverters 205, 205E of detection 200 may be replaced with any logic circuit capable of transmitting to an output a change of logic level on an input, the logic circuit comprising at least one cell 100 configured to change the logic level of the output when cell 100 detects an ionizing radiation particle. Such a circuit may in particular be a NOR logic gate.

Various embodiments and variations have been described. It will be understood by those skilled in the art that certain features of these various embodiments and variations may be combined, and other variations will occur to those skilled in the art. In particular, in the above described embodiments, the N and P conductivity types and the high and low potentials, in particular potentials VDD and GND, may be exchanged.

Finally, the practical implementation of the described embodiments and variations is within the abilities of those skilled in the art based on the functional indications given hereabove.

The invention claimed is:

1. A device, comprising:
    a diode and a transistor connected in parallel and configured to detect an ionizing radiation;
    wherein the transistor is located in and on a semiconductor layer positioned over and electrically insulated from a first doped region in contact with a second doped region that is located under the first doped region to form a PN junction of the diode.

2. The device of claim 1, further comprising an electrically-insulating layer positioned between the semiconductor layer which includes a channel region of the transistor and the first doped region.

3. The device of claim 2, wherein the semiconductor layer further comprises a drain region of the transistor on one side of the channel region and a source region of the transistor on an opposite side of the channel region, and wherein the electrically insulating layer is positioned between the first doped region and the semiconductor layer within which the channel region, source region and drain region are located.

4. The device of claim 3, wherein the semiconductor layer is an upper layer of a semiconductor on insulator (SOI) substrate and wherein the first doped region and second doped region are located within a support layer of the SOI substrate.

5. The device of claim 2, wherein the first doped region forms a back gate of the transistor.

6. The device of claim 2, wherein the PN junction extends parallel to an upper surface of the semiconductor layer.

7. The device of claim 1, wherein the transistor has an N channel and the first doped region is N-type doped.

8. The device of claim 1, further comprising a semiconductor support substrate including a portion defining the second region, and a doped well defining the first region.

9. The device of claim 8, wherein said doped well comprises a vertically extending portion of the doped well which is laterally insulated from the semiconductor layer.

10. The device of claim 8, wherein a first region of the doped well forms a back gate of the transistor.

11. The device of claim 8, wherein the PN junction extends parallel to an upper surface of the semiconductor layer.

12. The device of claim 1, wherein the PN junction responds to the ionizing radiation by generating a current.

13. The device of claim 12, further comprising a circuit configured to compare a threshold voltage against a voltage generated across the transistor in response to the current.

14. The device of claim 13, wherein the circuit configured to compare comprises a further transistor having a gate controlled by said voltage.

15. An ionizing radiation detector, comprising:
at least one device, wherein the device comprises:
a diode and a transistor connected in parallel and configured to generate a current in response to ionizing radiation;
wherein the transistor is located over and insulated from a first doped region that is in contact with a second doped region located under the first doped region to form a PN junction of the diode.

16. The detector of claim 15, wherein said at least one device is a plurality of devices and wherein the diode of one of the plurality of devices is coupled to a gate of the transistor of another one of the plurality of devices.

17. The detector of claim 16, wherein each device is a component of an inverter circuit having a first transistor and second transistor coupled in series, with said transistor comprising one of the first and second transistors.

18. The detector of claim 17, each inverter is coupled in series another inverter.

19. The detector of claim 15, wherein the current is generated through the PN junction in response to the ionizing radiation.

20. The detector of claim 19, further comprising a circuit configured to compare a threshold voltage against a voltage generated across the transistor in response to the current.

21. The detector of claim 20, wherein the circuit configured to compare comprises a further transistor having a gate controlled by said voltage.

22. The detector of claim 21, wherein said at least one device is a plurality of devices, wherein the voltage is generated by one of said devices and wherein said further transistor is a transistor of another one of said devices.

* * * * *